US 8,237,471 B2

(12) United States Patent
Anderson et al.

(10) Patent No.: US 8,237,471 B2
(45) Date of Patent: Aug. 7, 2012

(54) CIRCUIT WITH STACKED STRUCTURE AND USE THEREOF

(75) Inventors: Brent A. Anderson, Jericho, VT (US);
Andres Bryant, Burlington, VT (US);
Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/626,169

(22) Filed: Nov. 25, 2009

(65) Prior Publication Data

US 2011/0121862 A1 May 26, 2011

(51) Int. Cl.
*H03K 19/20* (2006.01)
(52) U.S. Cl. ......... 326/112; 326/114; 326/120; 257/344
(58) Field of Classification Search .................. 326/112, 326/114, 119–120; 257/344
See application file for complete search history.

(56) References Cited

U.S. PATENT DOCUMENTS

| | | | | |
|---|---|---|---|---|
| 5,030,853 A * | 7/1991 | Vinal | ............................... | 326/84 |
| 5,608,240 A * | 3/1997 | Kumagai | ...................... | 257/204 |
| 5,830,788 A * | 11/1998 | Hiroki et al. | .................. | 438/199 |
| 6,031,268 A * | 2/2000 | Hiroki et al. | .................. | 257/345 |
| 6,078,195 A * | 6/2000 | Chen | ............................. | 326/121 |
| 6,466,489 B1 * | 10/2002 | Ieong et al. | ............. | 365/189.09 |
| 2001/0013628 A1 * | 8/2001 | Tyagi et al. | ................... | 257/408 |
| 2007/0040621 A1 * | 2/2007 | Ngo et al. | ....................... | 331/57 |
| 2007/0090442 A1 | 4/2007 | Shih et al. | | |

* cited by examiner

*Primary Examiner* — Jason M Crawford
(74) *Attorney, Agent, or Firm* — Michael Le Strange; Roberts Mlotkowski Safran & Cole, P.C.

(57) ABSTRACT

An NAND circuit has a stacked structure having at least one symmetric NFET at a bottom of the stack. More particularly, the circuit has a stacked structure which includes an asymmetric FET and a symmetric FET. The symmetric FET is placed at the bottom of the stacked structure closer to ground than the asymmetric FET.

18 Claims, 3 Drawing Sheets

CIRCUIT WITH STACKED STRUCTURE AND USE THEREOF

FIELD OF THE INVENTION

The invention relates to a circuit with a symmetric FET and, more particularly, to a NAND circuit with a stacked structure having at least one symmetric NFET at a bottom of the stack.

BACKGROUND OF THE INVENTION

Digital systems employing certain logic circuits take advantage of the functional completeness of the NAND, i.e., any logic function (AND, OR, etc.) can be implemented using NAND and NOR gates More specifically, an NAND gate is a digital logic gate that behaves in a particular manner. For example, a low output results only if both the inputs to the gate are high. However, if one or both inputs are low, a high output results. NAND gates can also be made with more than two inputs, yielding an output of low if all of the inputs are high, and an output of high if any of the inputs is low. These kinds of gates therefore operate as n-ary operators instead of a simple binary operator.

In conventional systems, a NAND gate includes a stacked configuration of two asymmetric FETs in series. The asymmetric FETs provide the advantage of low source external resistance, reduced floating body voltages and reduced drain-gate and drain-body capacitance during the saturation mode. Thus, advantageously, NAND circuits gain the advantage of the saturated current drive capabilities and low Miller capacitance of the asymmetric FET.

However, in the linear mode of operation, the voltage across the drain source becomes small thus making the device susceptible to weak overlap on the drain side. The weak drain overlap has a negligible impact on the saturated current drive; however, it has a significant impact on the linear current degradation in the linear mode. That is, the weak drain overlap leads to high drain external resistance that degrades Idlin. In turn, the Idlin degradation decreases the benefit of using the asymmetric NFETs in stacked NFET circuits.

More specifically, the stack (i.e., asymmetric NFETs) is highly susceptible when the top circuit is switched, as the stack is sensitive to the linear current drive of the devices at the bottom of the stack. Thus, the weak current overlap of the asymmetric NFETs leads to linear current degradation in the bottom of the device which has a significant impact on performance. Thus, although saturation current goes way up, the linear current degradation in the linear mode goes way down which will affect device performance. So, by using an asymmetric NFET at the bottom of the stack, the performance of the NFET is affected by the linear current degradation in the linear mode.

Accordingly, there exists a need in the art to overcome the deficiencies and limitations described hereinabove.

SUMMARY

In a first aspect of the invention, a circuit comprises a stacked structure comprising an asymmetric FET and a symmetric FET. The symmetric FET is placed at the bottom of the stacked structure closer to ground than the asymmetric FET.

In another aspect of the invention, a circuit comprises an asymmetric NFET having a source and a weak drain and a symmetric NFET stacked in series with the asymmetric NFET. The symmetric NFET has a drain in electrical connection with the source of the asymmetric NFET and a source connected to ground.

In yet another aspect of the invention, a process of operating a NAND circuit comprises applying a voltage to at least one of an asymmetric NFET and symmetric NFET in a stacked configuration such that saturated current drive capabilities and low Miller capacitance are achieved during a saturation mode of operation using the asymmetric NFET and linear current drive degradation is avoided during a linear mode of operation using the symmetric NFET, thereby increasing top switch speed.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a circuit with a symmetric FET and, more particularly, to a NAND circuit with a stacked structure having at least one symmetric NFET and asymmetric NFET. More specifically, in embodiments, the NAND circuit of the present invention addresses the top switch performance of a NAND by including a stacked structure comprising, in series, an asymmetric NFET at the top of the stack and at least one symmetric NFET near ground (e.g., at the bottom). In this configuration, the present invention receives the benefits of both an asymmetric NFET and a symmetric NFET, e.g., reduces node capacitance without significantly degrading current drive.

More specifically, advantageously in the configuration of the present invention, the asymmetric NFET reduces capacitance at the output (e.g., drain) of the circuit. That is, the asymmetric NFET improves short channel effects which, in turn, increases the effective current drive of the circuit. Even more specifically, by using the asymmetric NFET in the NAND circuit it is possible to retain the benefits of low source external resistance, reduced floating body voltages and reduced drain-gate and drain-body capacitance in the saturation mode. In this way, by keeping the asymmetric NFET at the top of the stack where the linear current is not significantly important, it is possible to gain from the saturated current drive capabilities of the asymmetric NFET and its low Miller capacitance.

Advantageously, though, as the circuit includes a symmetric NFET at the bottom of the device, the device no longer suffers from a weak drain overlap which would lead to high drain external resistance that degrades Idlin. Instead, using the symmetric NFETs on the bottom of the stack, it is possible to maintain/increase higher linear current drive capability which addresses top switch speed (which would otherwise be of consequence using the asymmetric NFET at the bottom of the stack). Thus, using the configuration of the present invention it is now possible to reduce the node capacitance of the circuit without significantly degrading current drive.

Figure 1:
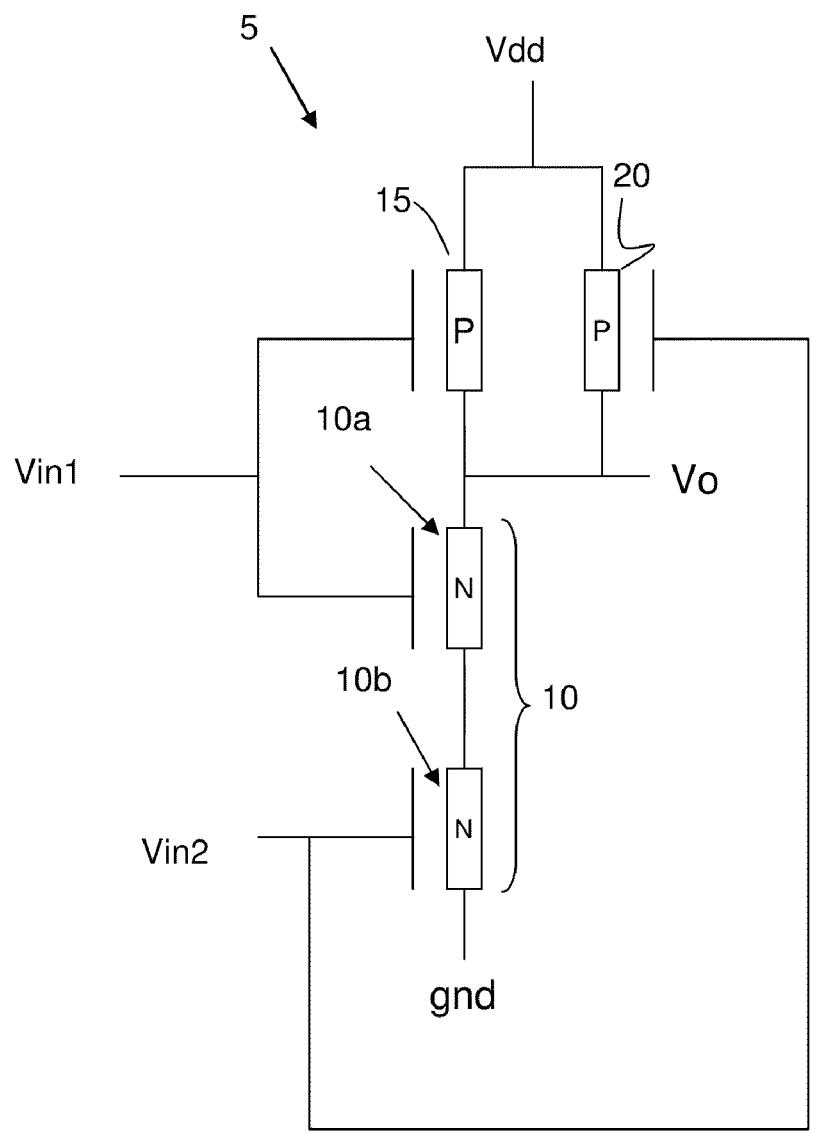
FIG. 1 is a circuit (system) in accordance with aspects of the invention.

FIG. 1 is a circuit (system) in accordance with aspects of the invention. In particular, the present invention includes a NAND circuit 5 which has a unilateral circuit stacked in a single direction as shown generally at reference numeral 10. In one embodiment, the stacked circuit 10 includes, in series, both an asymmetric NFET 10a and a symmetric NFET 10b. In embodiments, the asymmetric NFET 10a is at the top of the stack and the symmetric NFET 10b is at the bottom of the stack, electrically connected to ground by at its source. The drain of the symmetric NFET 10b is electrically connected to the source of the asymmetric NFET 10a.

The asymmetric NFET 10a includes a weak extension/diffusion drain which is connected to output Vo (Vout) and a pair of PFETs 15, 20, configured in parallel. The asymmetric NFET 10a also includes a halo only at the source and a highly overlapped high dose source extension. As its input, the asymmetric NFET 10a is connected to $V_{in1}$. $V_{in1}$ is also connected to the PFET 15, which is in parallel with the PFET 20. Vdd is connected to the PFETs 15, 20. As its input, the symmetric NFET 10b is connected to $V_{in2}$.

In the circuit of FIG. 1, as shown representatively in Table 1 below, Vout is connected to Vdd by either of the PFETs 15, 20 when:

(i) $V_{in1}$ and $V_{in2}$ are low;
(ii) $V_{in1}$ is low and $V_{in2}$ is high; and
(iii) $V_{in1}$ is high and $V_{in2}$ is low.

In the above scenarios, at least one of the PFETs 15, 20 is in the "on" condition and at least one of the NFETs 10a, 10b is in the "off" condition. However, when $V_{in1}$ and $V_{in2}$ are both high, the NFETs 10a, 10b are in the "on" condition and Vout is connected to GND. In this scenario, though, both of the PFETs 15, 20 are in the "off" connection and there is no connection to Vdd.

TABLE 1

| $V_{in1}$ | $V_{in2}$ | $V_{out}$ ($V_{out}$ connected to Vdd = 1; $V_{out}$ connected to GND = 0) |
|---|---|---|
| 0 | 0 | 1 |
| 0 | 1 | 1 |
| 1 | 0 | 1 |
| 1 | 1 | 0 |

Advantageously, by using the configuration of the present invention it is possible to retain the capacitance reduction capabilities and input capacitance reduction of the circuit 5, while also avoiding an increase in effective resistance for the top switch of the NAND circuit. That is, the asymmetric NFET 10a advantageously provides a low source external resistance, reduces floating body voltage and drain-gate and drain-body capacitance. In this way, the asymmetric NFET 10a provides a net Ieff increase and capacitance reduction that yields an improved inverter delay reduction.

However, by using the symmetric NFET 10b is it now possible to improve the linear current drive through the series devices (NFETs 10a and 10b) in the linear mode of operation (compared to having two asymmetric NFETs in series which would drain the linear current (i.e., weak current) due to the overlap of the weak drain). More specifically, by using the symmetric NFET 10b is it now possible to avoid weak drain overlap which would lead to high drain external resistance that degrades Idlin. Thus, in operation, the saturated current drive capabilities and low Miller capacitance are achieved during a saturation mode of operation using the asymmetric NFET and linear current drive degradation is avoided during a linear mode of operation using the symmetric NFET, thereby increasing top switch speed.

Figure 2:
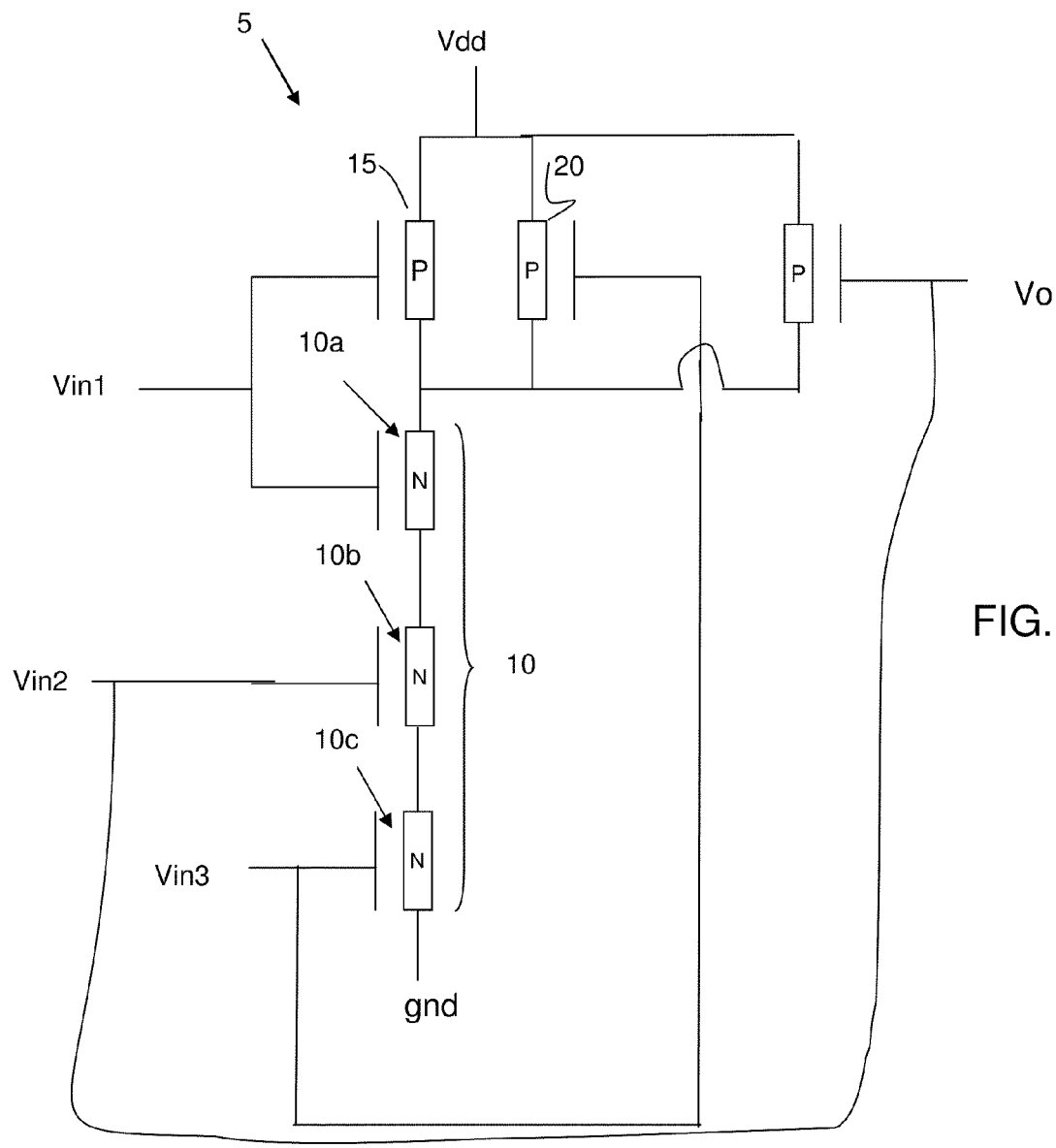
FIG. 2 is a circuit (system) in accordance with aspects of the invention.

FIG. 2 is a circuit (system) in accordance with another aspect of the invention. FIG. 2 shows an expanded NAND circuit 5 which has a unilateral circuit 10 stacked in a single direction. In this embodiment, the stacked circuit 10 includes, in series, an asymmetric NFET 10a, a symmetric NFET 10b and a symmetric NFET 10c. As should be understood by those of skill in the art, the NAND circuit 5 can be expanded to include a stacked structure with an asymmetric NFET and symmetric NFETs for all of the remaining devices as discussed below.

Similar to that shown and described with reference to FIG. 1, the source of the asymmetric NFET 10a is electrically connected to the drain of the symmetric NFET 10b. In turn, the source of the symmetric NFET 10b is connected, in series, with the drain of the symmetric NFET 10c, and the source of the symmetric NFET 10c is connected in series to GND.

As in the embodiment of FIG. 1, the asymmetric NFET 10a includes a weak extension/diffusion drain which is connected to output Vo (Vout) and a pair of PFETs 15, 20, configured in parallel. As its input, the asymmetric NFET 10a is connected to $V_{in1}$. $V_{in1}$ is also connected to the PFET 15, which is in parallel with the PFET 20. Vdd is connected to the PFETs 15, 20. As its input, the symmetric NFET 10b is connected to $V_{in2}$ and the symmetric NFET 10c is connected to $V_{in3}$ The symmetric NFET 10c is also connected to GND at its source.

Those of skill in the art should understand that the present invention is not limited to the configurations shown in FIGS. 1 and 2. Instead, the present invention contemplates other arrangements including, for example, three or more symmetric NFETs at the bottom of the stack. In additional embodiments, which can also be representative of FIG. 2, different combinations of symmetric and asymmetric NFETs are contemplated by the present invention. In any of these additional embodiments, the symmetric NFET should preferably be at the bottom of the stack, connected to GND.

Figure 3:
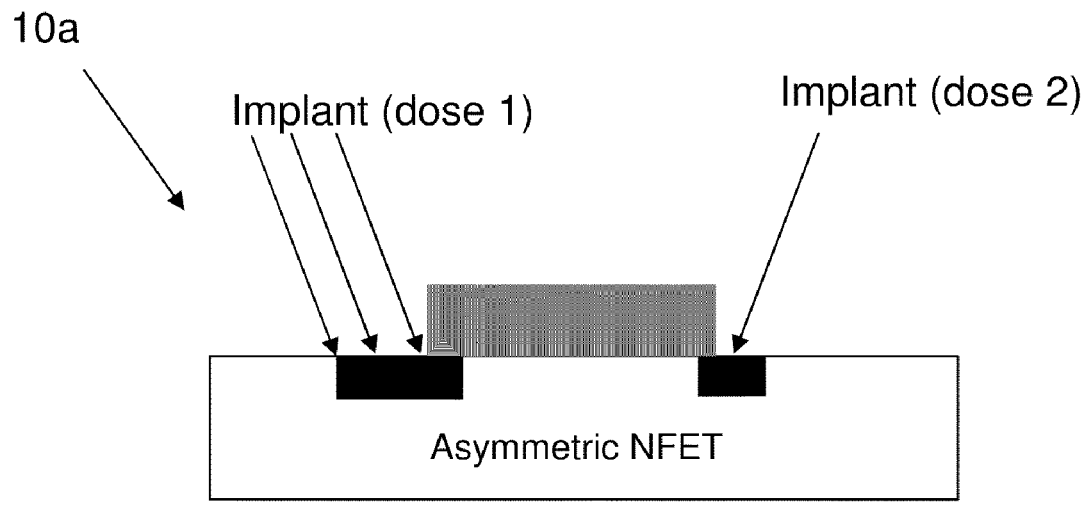
FIG. 3 is an exemplary asymmetric FET used in the circuit of FIG. 1 or FIG. 2 in accordance with aspects of the invention.

FIG. 3 is an exemplary asymmetric FET used in the circuit of FIG. 1 or FIG. 2 in accordance with aspects of the invention. As shown in FIG. 3, the exemplary asymmetric FET 10a has an asymmetry in S/D profile, e.g., dose 1 is higher than dose 2. More specifically, it is contemplated by the present invention that the asymmetric FET 10b includes a weak extension/diffusion drain and a halo only at the source and a highly overlapped high dose source extension. It is further contemplated by the invention that the asymmetric exemplary FET 10a can have an asymmetry in the gate spacing or other feature, as is known to those of skill in the art. As such, it should be understood by those of skill in the art that the exemplary asymmetric FET shown in FIG. 3 is only an illustrative example and should not be considered a limiting feature of the present invention.

Figure 4:
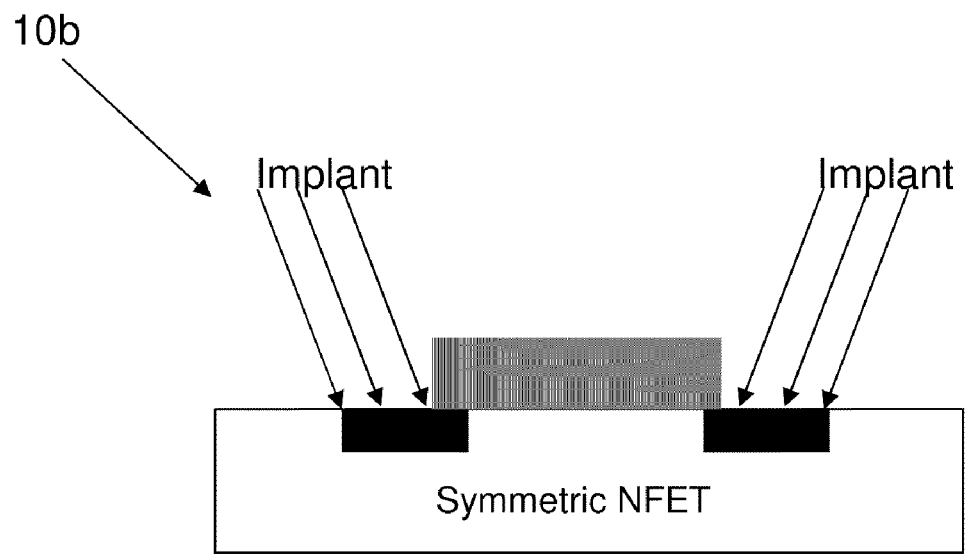
FIG. 4 is an exemplary symmetric FET used in the circuit of FIG. 1 or FIG. 2 in accordance with aspects of the invention.

FIG. 4 is an exemplary symmetric FET used in the circuit of FIG. 1 or FIG. 2 in accordance with aspects of the invention. As shown in FIG. 4, the symmetric FET 10b has a symmetry in the S/D profile, as well as other features of the FET. For example, the dose implant for the source and drain shown representatively in FIG. 4 is equal, as is the gate spacing and other features of the device. It should be understood, though, that the exemplary symmetric FET shown herein is only an illustrative example and should not be considered a limiting feature of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A NAND circuit comprising a stacked structure comprising an asymmetric FET and a symmetric FET, the symmetric FET being placed at the bottom of the stacked structure closer to ground than the asymmetric FET, wherein the asymmetric FET comprises a first implant dose on a first side of the asymmetric FET and a second implant does on a second side of the asymmetric FET, the first implant does being different than the second implant dose, and the symmetric FET comprises implant doses on a source and a drain of the symmetric FET, which are equal, wherein the asymmetric FET and the symmetric FET are NFETs.

2. The circuit of claim 1, wherein the stacked structure is a unilateral circuit stacked in a single direction.

3. The circuit of claim 1, wherein the asymmetric FET has the weak drain connected to an output Vout.

4. The circuit of claim 3, wherein the asymmetric FET is connected to a pair of PFETs arranged in parallel.

5. The circuit of claim 4, wherein the pair of PFETs and Vout are arranged on a drain side of the asymmetric FET.

6. The circuit of claim 1, wherein the symmetric FET is connected to ground at its source side.

7. The circuit of claim 1, further comprising a second symmetric FET in series with the symmetric FET and the asymmetric FET, the second symmetric FET being positioned between the symmetric FET and the asymmetric FET.

8. The circuit of claim 1, further comprising additional symmetric FETs for other devices of the stacked structure.

9. The circuit of claim 1, wherein the asymmetric NFET has low source external resistance, reduced floating body voltages and reduced drain-gate and drain-body capacitance in a saturation mode and the symmetric NFET maintains linear current drive capability in a linear mode of operation, which addresses top switch speed.

10. The circuit of claim 1, wherein:
the asymmetric FET is configured to improve short channel effects which, in turn, increases effective current drive of the circuit;
output Vout is connected to a power supply Vdd by either of two PFETs connected in parallel and to the asymmetric NFET and the symmetric NFET;
inputs $V_{in1}$ and $V_{in2}$ are low; the input $V_{in1}$ is low and the input $V_{in2}$ is high; and the input $V_{in1}$ is high and the input $V_{in2}$ is low, at least one of the PFETs is in an "on" condition and at least one of the asymmetric and symmetric FETs is in the "off" condition;
when the input $V_{in1}$ and the input $V_{in2}$ are both high, the asymmetric and symmetric FETs are in the "on" condition and output Vout is connected to a GND supply and both of the PFETs are in an "off" connection and there is no connection to the power supply Vdd;
the asymmetric FET provides a low source external resistance, reduces floating body voltage and drain-gate and drain-body capacitance; and
the asymmetric FET provides a net current Ieff increase and capacitance reduction that yields an inverter delay reduction; and
the symmetric FET avoids weak drain overlap which would lead to high drain external resistance that degrades a current Idlin such that, in operation, saturated current drive capabilities and low Miller capacitance are achieved during a saturation mode of operation using the asymmetric FET and linear current drive degradation is avoided during a linear mode of operation using the symmetric FET.

11. The circuit of claim 1, wherein:
the asymmetric FET and the symmetric FET are NFETs;
the stacked structure is a unilateral circuit stacked in a single direction;
the asymmetric FET has the weak drain connected to an output Vout;
the asymmetric FET is connected to a pair of PFETs arranged in parallel;
the pair of PFETs and Vout are arranged on a drain side of the asymmetric FET;
the symmetric FET is connected to ground at its source side; and
the asymmetric NFET has low source external resistance, reduced floating body voltages and reduced drain-gate and drain-body capacitance in a saturation mode and the symmetric NFET maintains linear current drive capability in a linear mode of operation, which addresses top switch speed; and further comprising:
a second symmetric FET in series with the symmetric FET and the asymmetric FET, the second symmetric FET being positioned between the symmetric FET and the asymmetric FET; and
additional symmetric FETs for other devices of the stacked structure.

12. The circuit of claim 11, wherein:
a gate spacing of the asymmetric FET is asymmetrical;
a gate spacing of each of the symmetric FET and the second symmetric FET is symmetrical; and
the circuit further comprises at least one symmetric FET in series with the symmetric FET, the asymmetric FET, and the second symmetric FET, the at least one symmetric FET being positioned between the symmetric FET and the second symmetric FET.

13. A circuit, comprising:
an asymmetric NFET having a first implant dose on a first side of the asymmetric NFET and a second implant dose on a second side of the asymmetric NFET, the first implant dose being different than the second implant dose;

a symmetric NFET stacked in series with the asymmetric NFET, the symmetric NFET having a drain in electrical connection with a source of the asymmetric NFET and a source connected to ground, and the symmetric NFET having implant doses on the source and the drain of the symmetric NFET, which are equal; and a second symmetric NFET in series with the symmetric NFET and the asymmetric NFET, the second symmetric NFET being positioned between the symmetric FET and the asymmetric NFET, wherein:

the asymmetric NFET and the symmetric NFET are in a stacked structure, with the asymmetric NFET being at a top of the stack;

the stacked structure is a unilateral circuit stacked in a single direction;

the weak drain of the asymmetric FET is connected to an output Vout and to a pair of PFETs arranged in parallel;

the asymmetric NFET has low source external resistance, reduced floating body voltages and reduced drain-gate and drain-body capacitance in a saturation mode and the symmetric NFET maintains linear current drive capability in a linear mode of operation; and the asymmetric NFET has capacitance reduction capabilities and input capacitance reduction and the symmetric NFET is configured to improve linear current drive in a linear mode of operation.

14. The circuit of claim 13, wherein:
a gate spacing of the asymmetric NFET is asymmetrical;
a gate spacing of the symmetric NFET is symmetrical; and
the circuit further comprises:
   a second symmetric NFET in series with the symmetric NFET and the asymmetric NFET, the second symmetric NFET being positioned between the symmetric NFET and the asymmetric NFET; and
   at least one symmetric NFET in series with the symmetric NFET, the asymmetric NFET, and the second symmetric NFET, the at least one symmetric NFET being positioned between the symmetric NFET and the second symmetric NFET.

15. A process of operating a NAND circuit comprising applying a voltage to at least one of an asymmetric NFET and two symmetric NFETs in a stacked configuration such that saturated current drive capabilities and low Miller capacitance are achieved during a saturation mode of operation using the asymmetric NFET and linear current drive degradation is avoided during a linear mode of operation using the two symmetric NFETs, thereby increasing top switch speed, wherein the asymmetric NFET comprises a first implant dose on a first side of the asymmetric NFET and a second implant dose on a second side of the asymmetric NFET, the first implant dose being different than the second implant dose, and each of the two symmetric NFETs comprises implant doses on a source and a drain of each of the two symmetric NFETs, which are equal.

16. The process of claim 15, wherein the voltage to the asymmetric NFET and the two symmetric NFETs are high in the linear mode of operation.

17. The process of claim 16, wherein the voltage travels to ground directly from a source of the two symmetric NFETs.

18. The process of claim 15, wherein:
a gate spacing of the asymmetric NFET is asymmetrical;
a gate spacing of each of the two symmetric NFETs is symmetrical; and
the process further comprises applying a voltage to at least one symmetric NFET in series with the two symmetric NFETs and the asymmetric NFET, the at least one symmetric NFET being positioned between the two symmetric NFETs.

* * * * *